(12) United States Patent
Vanderpot et al.

(10) Patent No.: US 7,547,899 B2
(45) Date of Patent: *Jun. 16, 2009

(54) CHARGED BEAM DUMP AND PARTICLE ATTRACTOR

(75) Inventors: John W. Vanderpot, Boxford, MA (US); Yongzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 459 days.

This patent is subject to a terminal disclaimer.

(21) Appl. No.: 11/445,677

(22) Filed: Jun. 2, 2006

(65) Prior Publication Data

US 2006/0284117 A1    Dec. 21, 2006

Related U.S. Application Data

(60) Provisional application No. 60/687,514, filed on Jun. 3, 2005.

(51) Int. Cl.
*G21K 5/10* (2006.01)
*H01J 37/08* (2006.01)

(52) U.S. Cl. .......................... 250/492.21; 250/396 R; 250/398; 250/492.2; 250/423 R; 250/397; 250/400; 250/492.3; 250/251; 250/492.22; 250/396 ML; 427/523; 204/298.04; 200/252

(58) Field of Classification Search ............ 250/492.21, 250/396 R, 398, 492.2, 428 R, 397, 400, 250/492.3, 251, 492.22, 396 ML, 423 R; 427/523; 204/298.04; 200/252

See application file for complete search history.

(56) References Cited

U.S. PATENT DOCUMENTS

| | | | |
|---|---|---|---|
| 5,134,299 A | 7/1992 | Denholm | |
| 6,501,078 B1 | 12/2002 | Ryding et al. | |
| 6,661,016 B2 | 12/2003 | Berrian | |
| 2002/0053642 A1 | 5/2002 | Berrian | |
| 2006/0284116 A1 * | 12/2006 | Berrian et al. | 250/492.21 |

FOREIGN PATENT DOCUMENTS

| | | |
|---|---|---|
| EP | 1030344 A2 | 8/2000 |
| GB | 2345574 A | 7/2000 |

OTHER PUBLICATIONS

U.S. Appl. No. 11/445,667, filed Jun. 2, 2006, Berrian et al.
U.S. Appl. No. 11/445,722, filed Jun. 2, 2006, Vanderpot et al.
International Search Report for International Patent Application PCT/US06/021647; Mailing Date of Mar. 9, 2007, p. 1-6.

* cited by examiner

*Primary Examiner*—Jack I Berman
*Assistant Examiner*—Meenakshi S Sahu
(74) *Attorney, Agent, or Firm*—Eschweiler & Associates, LLC

(57) ABSTRACT

A system, method, and apparatus for mitigating contamination during ion implantation are provided. An ion source, end station, and mass analyzer positioned between the ion source and the end station are provided, wherein an ion beam is formed from the ion source and travels through the mass analyzer to the end station. An ion beam dump assembly comprising a particle collector, particle attractor, and shield are associated with the mass analyzer, wherein an electrical potential of the particle attractor is operable to attract and constrain contamination particles within the particle collector, and wherein the shield is operable to shield the electrical potential of the particle attractor from an electrical potential of an ion beam within the mass analyzer.

28 Claims, 4 Drawing Sheets

CHARGED BEAM DUMP AND PARTICLE ATTRACTOR

REFERENCE TO RELATED APPLICATION

This application claims priority to and the benefit of U.S. Provisional Application Ser. No. 60/687,514 which was filed Jun. 3, 2005, entitled PARTICULATE PREVENTION IN ION IMPLANTATION, the entirety of which is hereby incorporated by reference as if fully set forth herein.

FIELD OF THE INVENTION

The present invention relates generally to an ion implantation system, apparatus, and method for implanting ions into a workpiece, and more specifically to a system, apparatus, and method for generally preventing particulate contamination associated with an ion beam.

BACKGROUND OF THE INVENTION

In the manufacture of semiconductor devices, ion implantation systems are employed to dope a semiconductor wafer or other workpiece with impurities. In such systems, an ion source ionizes a desired dopant element, which is extracted from the source in the form of an ion beam. The ion beam is typically mass analyzed to select ions of a desired charge-to-mass ratio and then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

Typically, the ions generated from the ion source are formed into a beam and directed along a predetermined beam path to an implantation station. The ion beam implanter may further include beam forming and shaping structures extending between the ion source and the implantation station. The beam forming and shaping structures attempt to maintain the ion beam and bound an elongated interior cavity or passageway through which the beam passes en route to the implantation station. When operating the ion implanter, this passageway is typically evacuated to reduce the probability of ions being deflected from the predetermined beam path as a result of collisions with air molecules.

The mass of an ion relative to the charge thereon (i.e., charge-to-mass ratio) affects the degree to which it is accelerated both axially and transversely by an electrostatic or magnetic field. Therefore, the beam that reaches a desired area of a semiconductor wafer or other target can be made quite pure, since ions of undesirable molecular weight will be deflected to positions away from the beam and implantation of ions of other than the desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway that will effectively separate ions of different charge-to-mass ratios.

The ion beam is typically focused and directed at a desired surface region of the workpiece. Generally, the energetic ions of the ion beam are accelerated to a predetermined energy level to penetrate into the bulk of the workpiece. The ions, for example, are embedded into the crystalline lattice of the material to form a region of desired conductivity, with the energy of the ion beam generally determining the depth of implantation. Examples of ion implantation systems include those available from Axcelis Technologies of Beverly, Mass.

Operation of a typical ion implanter or other ion beam equipment (e.g., a linear accelerator), however, may result in the production of contaminant particles from various sources. The contaminant particles, for example, may be less than about 1 μm in size, yet still have a deleterious effect on the implanted workpiece. The contaminant particles, for example, may become entrained in the ion beam and transported with the beam toward the workpiece, thus resulting in undesired contamination at the workpiece.

In a typical ion implantation system, for example, one source of contaminant particles is material associated with the passageway through the mass analyzer. For example, the passageway of the mass analyzer is typically covered or coated with graphite, wherein the undesirable ions generally impact the graphite lining the passageway and become generally entrained in the graphite coating. Over time, however, as ions continue to strike the graphite coating, particles of the graphite coating may become dislodged from the passageway and then become entrained in the ion beam. Subsequently, these contaminant particles within the ion beam can collide with and adhere to the workpiece or other substrate during ion implantation, and can consequently become a source of yield loss in the fabrication of semiconductor and other devices that require submicroscopic pattern definition on the treated workpieces.

As semiconductor devices are manufactured at reduced sizes with greater precision, higher accuracy and efficiency are required of apparatuses for manufacturing such semiconductor devices. Accordingly, it is desirable to reduce the level of contaminant particles in the ion beam at various positions upstream of the workpiece, so as to mitigate workpiece contamination.

SUMMARY OF THE INVENTION

The present invention overcomes the limitations of the prior art by providing an apparatus, system, and method for controlling contamination associated with an ion beam at various positions upstream of a workpiece. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

According to one exemplary aspect of the present invention, a beam dump assembly is provided for reducing contamination of an ion beam in an ion implantation system is provided, wherein the beam dump assembly comprises a particle collector, a particle attractor, and a shield. An electrical potential of the particle attractor is operable to generally attract and slow waste ion beams formed by the ion implantation system, wherein contamination particles associated with the waste ion beams are generally constrained within the particle collector. For example, the electrical potential of the particle attractor is generally opposite of an electrical potential of the ion beam, wherein the waste ion beams are generally attracted to the particle attractor within the particle collector.

The shield, in one example, is operable to shield the electrical potential associated with the particle attractor from the ion beam outside of the particle collector, such as within an interior region of a mass analyzer of the ion implantation system. The shield is further perforated, wherein the shield generally permits most of the waste ion beams to enter the particle collector, while still shielding the electrical potential of the particle attractor from the rest of the ion implantation system. For example, the shield is electrically grounded, or at the same electrical potential as walls of the mass analyzer, wherein the ion beam within the mass analyzer is not affected by the electrical potential of the particle attractor, unless the ion beam passes through the shield. However, once waste ion beams enter the particle attractor (via passing through the perforated shield), particle contamination associated with the waste ion beams is generally constrained within the particle collector via the electrical potential difference between the particle attractor and the waste ion beams.

In accordance with the present invention, the particle collector may comprise a generally concave housing, wherein an interior region is generally lined with a carbon-containing material, such as graphite. The lining of the particle collector, for example, is operable to substantially constrain heavier or solid particles associated with the waste ion beams. According to another example, a pump is provided, wherein the pump is in fluid communication with a collection region of the particle collector, wherein gaseous and/or suspended particles within the collector region can be pumped or exhausted out of the beam dump assembly, thus further reducing particle contamination.

According to another exemplary aspect of the invention, the beam dump assembly further comprises an insulator that generally electrically isolates one or more of particle collector, particle attractor, shield, and one or more components of the ion implantation system, such as a wall of the ion implantation system, from one another.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
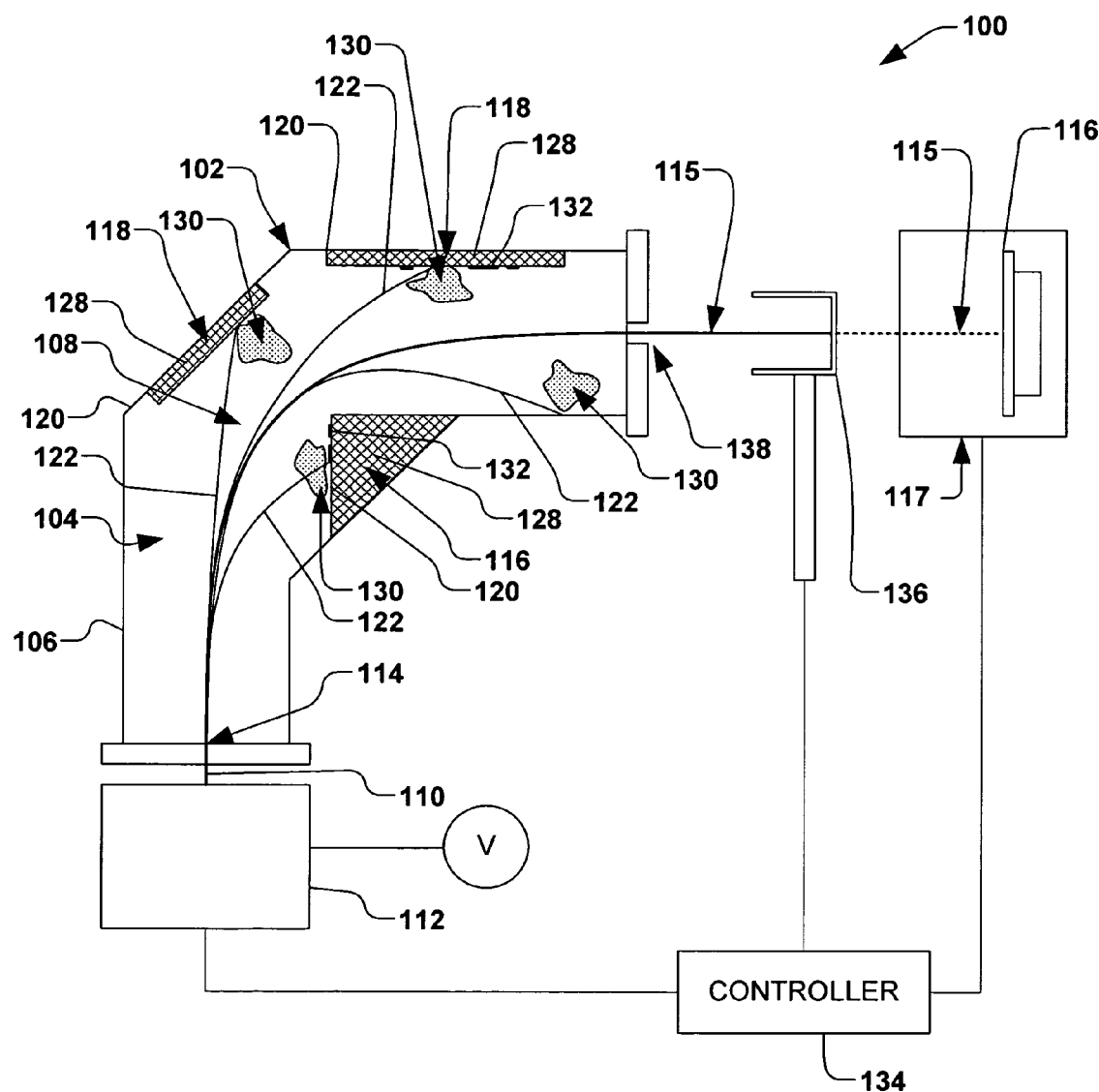
FIG. 1 is a plan view of an exemplary ion implantation system according to one aspect of the present invention.

The present invention is directed generally towards systems, apparatuses, and methods for generally mitigating particulate contamination of a workpiece being subjected to an ion beam. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates a simplified perspective view of an exemplary ion implantation system 100. It should be noted that the ion implantation system 100 of FIG. 1 is illustrated to provide an upper-level understanding of the invention, and is not necessarily drawn to scale. Accordingly, various components may or may not be illustrated for clarity purposes. FIG. 1 illustrates the top view of a vacuum chamber 102 that is inside a main magnetic field 104 of a mass analyzer 106 (also called a "magnet"), wherein a center 108 of the magnetic field is further shown. An ion beam 110 enters the mass analyzer 106 from an ion source 112 through an entrance 114 of the mass analyzer, and the magnet begins to separate the ion beam, based, at least in part, on the molecular weight of elements comprising the ion beam. The mass analyzer 106 is operable to extract a selected ray or beam 115 of a selected element (e.g., boron) from the ion beam 110, wherein ions of the selected beam are desirably implanted into a workpiece 116 (e.g., a semiconductor substrate) positioned within an end station 117. Lighter elements (e.g., hydrogen) that have lower molecular weights than the selected element tend to turn toward a first region 118, while heavier elements that are heavier in molecular weight than the selected element tend to turn toward a second region 119. The lightest elements that impact the first region 118 tend to cause damage to the vacuum chamber 102 upon striking a wall 120 of the chamber, while the heaver elements that strike the walls 120 of the chamber in the second region 119 may cause even more damage, due, at least in part, to their higher mass.

Elements that are not of the selected molecular weight (i.e., undesirable elements that are not in the selected beam 115) are called waste beams 122, since they are beams that are comprised of material that is not intended to be implanted into the workpiece 116 positioned in the end station 117. The walls 120 of the chamber 102 are lined with graphite 128, wherein upon the waste beams 122 striking the walls, the elements comprising the waste beams become entrained in the graphite. However, depending on the angle at which the waste beams 122 strike the graphite 128 of the walls 120, as well as chemical and/or physical properties of the waste beams, the elements of the waste beams may fail to bury themselves within the walls, and may further sputter some of the graphite away from the walls. In many cases, the ion beam 110 may comprise highly reactive materials or elements, such as fluorine, wherein the highly reactive materials may further remove material from the walls 120. The waste beams 122 may therefore cause clouds 130 of contamination particles (e.g., highly chemically reactive particles) to become lofted inside the vacuum chamber 102. Over time, the clouds 130 of contamination may build up, thus causing flakes 132 of the deleterious material to form and thicken on the walls 120 and other interior components. Eventually, the flakes 132 may spall off the walls 120 and other interior components, and become entrained in the selected ion beam 115, thereby leading to contamination on the workpiece 116. Furthermore, the clouds 130 may spread within the vacuum chamber 102. The clouds 130 may further collide with ion beams within the system 100 and become "charged" clouds, or floating charged particles. These charged particles can be subsequently "pushed" by the beam to reach the workpiece 116, therein leading to further particle contamination on the workpiece.

The present invention contemplates that the ion source 112 generally requires tuning of the ion beam 110 in order to provide the selected ion beam 115, wherein the tuning is generally performed while the ion source is running (e.g., power and gases are supplied to the ion source, wherein the ion beam 110 is formed). For example, the ion beam 110 is undifferentiated or unanalyzed at the entrance 114 of the mass analyzer 106, wherein all components of the ion beam are present. The ion beam 110 may comprise gases or materials comprising boron (B), fluorine (F), boron difluoride ($BF_2$), and other components prior to entering the mass analyzer 106, and in tuning the ion source 112, the mixture and electrical potential of the gases and materials are desirably set or "dialed in" via a controller 134, such that the resulting desired ion beam 115 is substantially stable and possesses the desired qualities prior to implanting ions into the workpiece 116. During tuning of the ion source 112, such as when cold-starting the ion implantation system 100 in the beginning of the day, the resultant ion beam 110 generally has a tendency to "misbehave", wherein sparks, flutter, and various other deleterious reactions can occur. Such misbehavior of the ion beam 110 during tuning can deleteriously accentuate the generation of the clouds 130 of contaminant particles within the vacuum chamber 102. These contaminant particles may pass through the mass analyzer 106 and be caught in a set up flag faraday 136 that is positioned to selectively block the selected ion beam 115 at an exit 138 of the mass analyzer. However, when the set up faraday 136 is positioned to let the ion beam 115 pass through to the workpiece 116, these contaminant particles can eventually make their way to the workpiece during implantation, thus negatively effecting product yield and performance of the resulting implanted workpiece.

Figure 2:
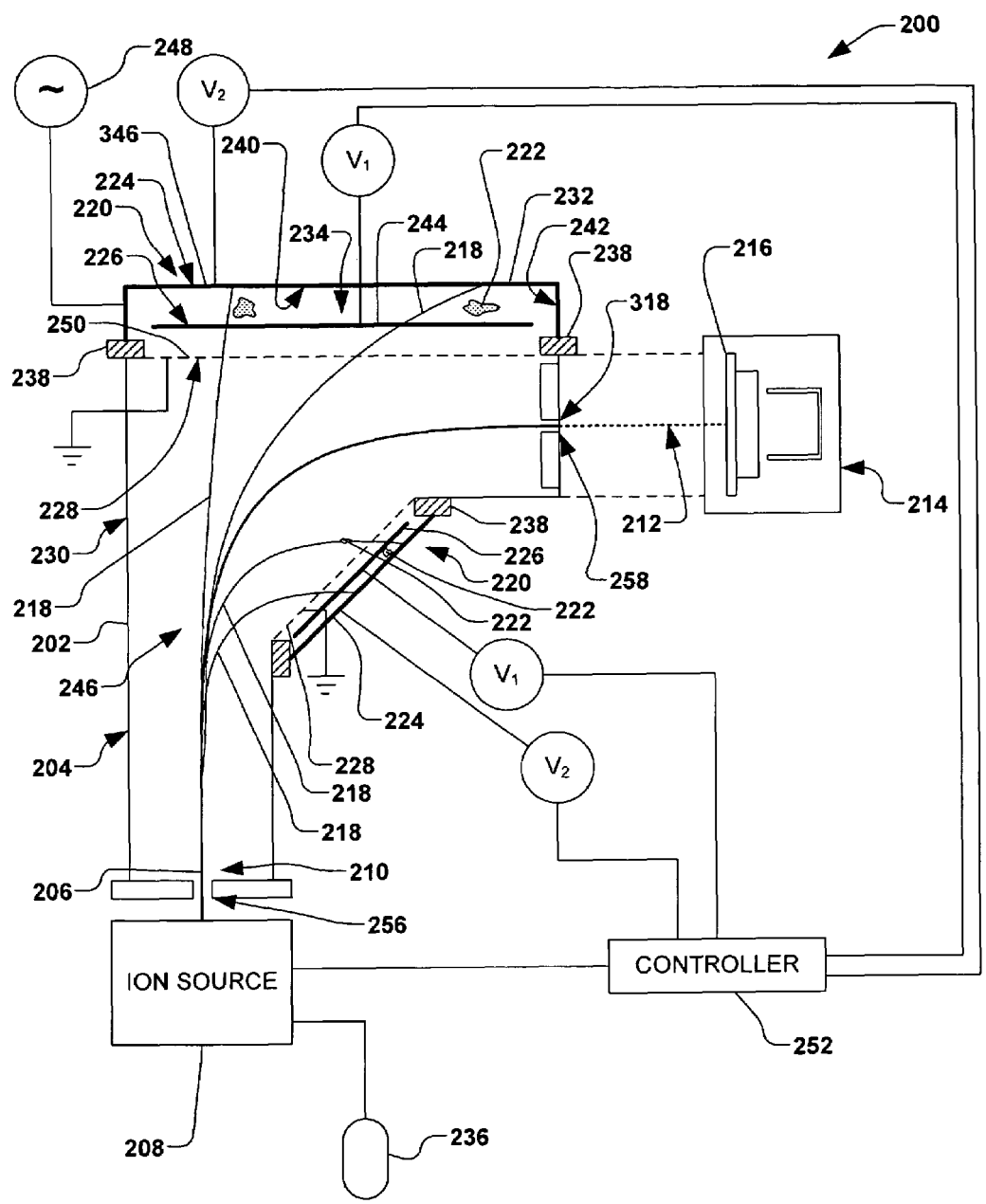
FIG. 2 is a plan view of an exemplary ion implantation system comprising an ion beam dump assembly according to another aspect of the present invention.

The present invention is directed to minimizing an amount of contamination that exits the mass analyzer 106, thus minimizing contamination of the workpiece 116. According to one aspect of the present invention, an exemplary ion implantation system 200 is illustrated in FIG. 2, wherein the ion implantation system illustrates several inventive aspects of the invention. It shall be understood that the various features illustrated can be of various shapes and sizes, or excluded altogether, and that all such shapes, sizes, and exclusions are contemplated as falling within the scope of the present invention. Similar to the ion implantation system 100 of FIG. 1, the ion implantation system 200 of FIG. 2 comprises a vacuum chamber 202 disposed within a mass analyzer 204, wherein an ion beam 206 is operable to enter the mass analyzer from an ion source 208 through an entrance 210 of the mass analyzer. The mass analyzer 204 is operable to extract a selected ion beam 212 of the ion beam 206 and direct the selected ion beam towards an end station 214, wherein a workpiece 216 generally resides therein. Elements of the ion beam 206 that are not of the same species as selected ion beam 212 generally form an arc of greater or lesser degrees than the selected ion beam, and thus, follow various waste beam paths 218.

In accordance with the present invention, undesirable particle contamination of the selected ion beam 212, such as that discussed above with reference to FIG. 1, can be ameliorated by confining the contamination to within the mass analyzer 204 of FIG. 2, as will now be discussed. According to the present invention, the ion implantation system 200, in one example, comprises a beam dump assembly 220 operable to generally confine undesirable contaminant particles 222 associated with waste beam paths 218 within the beam dump assembly. It should be noted that a plurality of dump assemblies 220 may be positioned at various predetermined locations within the ion implantation system 200 in order to efficiently reduce particle contamination of the selected ion beam 212. For example, the plurality of beam dump assemblies 220 are generally positioned such that the undesired waste beam paths 218 generally intersect one or more of the beam dump assemblies. Accordingly, the deleterious clouds 130 of contaminant particles and flakes 132 of FIG. 1 described above may be advantageously confined and/or purged from the ion implantation system 200 of FIG. 2 via the beam dump assemblies 220, as will be discussed infra.

In accordance with one exemplary aspect of the invention, each beam dump assembly 220 comprises a particle collector 224 (also called a "material dump"), a particle attractor 226, and a shield 228, wherein the beam dump assembly is operable to electrostatically attract and confine the contaminant particles 222 therein. In one example, the particle collector 224 is generally positioned along a wall 230 of the mass analyzer 204, wherein one or more of the undesirable waste ion beam paths 218 (e.g., ions having a higher mass than those of the selected ion beam 212) are generally directed. The particle collector 224, for example, comprises a generally concave housing 232, wherein a collection region 234 is generally defined therein. The housing 232, for example, is comprised of an electrically conductive housing material, such as a metal or graphite, wherein the housing material is selected based on the chemical nature of ion beam 206 (e.g., a chemically appropriate metal that is generally non-reactive with an ion source gas 236 utilized in the formation of the ion beam 206). An insulator 238, for example, is further provided between the housing 232 and the wall 230 of the mass analyzer 204, wherein the insulator 238 generally electrically insulates the housing from the wall. The insulator 238, for example, may further electrically isolate one or more of particle collector 224, particle attractor 226, shield 228, and the wall 230 of the ion implantation system 200 from one another. The housing 232, for example, further comprises a lining 240 generally covering an interior surface 242 of the housing, wherein the lining is comprised of an ion-absorptive material such as carbon (e.g., graphite). Alternatively, the lining 240 may be comprised of a variety of other materials, such as silicon carbide.

The particle attractor 226 generally resides within the collection region 234 of the particle collector 224, wherein the particle attractor is operable to electrostatically attract the contaminant particles 222 associated with the respective waste beam paths 218 thereto. For example, the particle attractor 226 comprises a suppression electrode 244, wherein the suppression electrode is operable to provide a difference in electrical potential or electrical environment from the perspective of the particle 222. For example, during operation of the ion implantation system 200, the contaminant particles 222 are generally charged similarly to a charge of the ion beam 206 (e.g., the contaminant particles are positively charged by a positive charge of the ion beam). Accordingly, the particle attractor 226 may be charged opposite to the charge of the ion beam 206 (e.g., a negative charge to the particle attractor), wherein the difference in electrical potential generally causes an electrostatic attraction between the particle attractor and the contaminant particles 222.

Accordingly, each beam dump assembly 220 is operable to provide an electrical field via the suppression electrode 244 within the collection region 234, such that the electrical field generally attracts and slows the contaminant particles 222 along the waste beam paths 218, and further generally prohibits the particles from re-entering an interior region 246 of the mass analyzer 204. The electrical potential may be further tuned such that the contaminant particles 222 may even become suspended in "mid air". Once the contaminant particles 222 are within the collection region 234 of the particle collector 224 or "material dump", they may be further pumped away (e.g., if the particles are gaseous or generally suspended in gas) via a pump 248. Alternatively, if the particles 222 are in a solid phase, they will generally collide with the lining 240 of the interior surface 242 of the housing 232, wherein the particles will advantageously become generally confined within or "stuck" to the lining.

The suppression electrode 244 (e.g., an electrostatic precipitator or "deceleration electrode"), therefore, is operable to provide an electrical field that is selected to prevent the particles 222 from leaving the material dump 224 once the particles are within the collection region 234 of the material dump. In accordance with another exemplary aspect of the invention, the shield 228 is provided to generally shield both the selected ion beam 212 and the waste beams 218 that are still in the interior region 246 of the vacuum chamber 202 from seeing the voltages at the suppression electrodes 244. The shield 228, for example, is electrically grounded, thus shielding the electrostatic field produced by the beam dump assembly 220 from the ion beam 206, and vice versa. According to one example, the shield 228 is generally perforated, and comprises a ground grid 250, wherein the ground grid generally permits most of the particles 222 within the waste beams 218 to pass through the ground grid 250, wherein once the particles are through the ground grid, they are only affected by the electrical field within the material dump 224. Such a change in electrical fields seen by the particles 222 of the waste beams 218 generally causes the particles to become "trapped" within the collection region 234 of the particle collector 224 (material dump).

Figure 3:
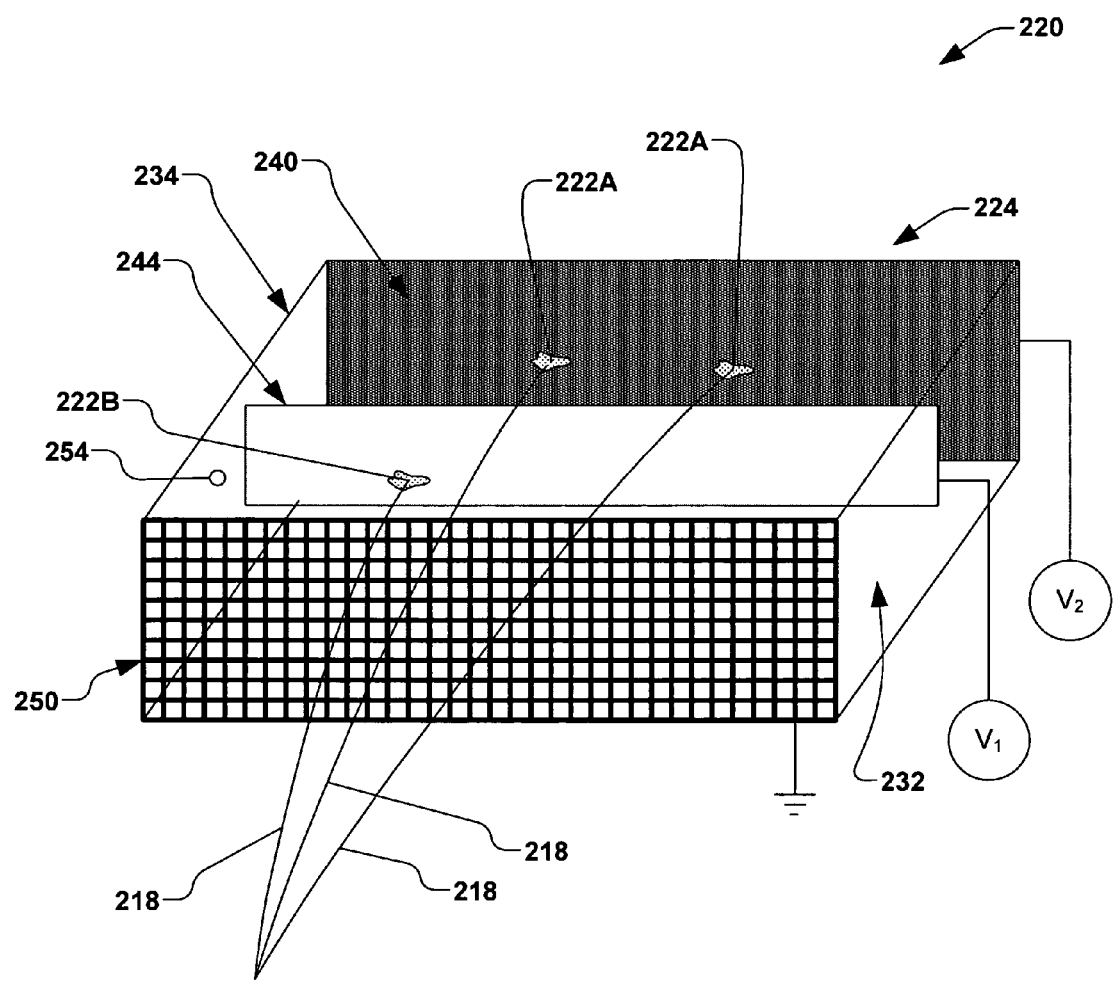
FIG. 3 is a partial perspective view of an exemplary ion beam dump assembly according to yet another aspect of the invention.

FIG. 3 illustrates an exemplary beam dump assembly 220 comprising the particle collector 224, wherein the particles 222 of waste beams 218 generally pass through the ground grid 250, and are generally attracted to the suppression electrode 244. Particles 222 that are generally in solid form (e.g., solid particle 222A) generally have a higher inertia, and become entrained in the lining 240 of the housing 232. However, these solid particles 222A are generally slowed via the electrical potential V applied to the suppression electrode 244 (via the controller 252 of FIG. 2), thus minimizing an impact force of the particles against the lining 240. Particles 222 that are in gaseous form or are substantially light in weight (e.g., gaseous particle 222B of FIG. 3) are generally suspended within the collection region 232 of the particle collector 224, and may be pumped out of the collection region via a port 254 fluidly coupled to the pump 248 of FIG. 2.

According to another aspect of the invention, the walls 230 of the vacuum chamber 202 of FIG. 2 are electrically grounded, wherein the shield 228 (e.g., the ground grid 250) does not affect the selected ion beam 212 within the chamber, since the desired beam (and the waste beams 218) do not "see" a difference in electrical potential within the interior region 246 of the vacuum chamber. Accordingly, the ground grid 250 acts as a clamp, wherein electrical fields from other voltages associated with the mass analyzer 204 are generally prevented from penetrating through the ground grid. The ground grid 250 may comprise various perforated materials, such as a mesh, a perforated plate, wire fence, parallel wires, or any other material or configuration operable to permit the waste beams 218 entry into the particle collector 224, while generally preventing re-entry into the interior region 246 of the vacuum chamber 202.

According to still another exemplary aspect of the invention, the beam dump assembly 220 may be associated with various other positions within or outside the vacuum chamber 202. For example, the beam dump assembly 220 may be associated with an aperture 256 at the entrance 210 or an exit 258 of the mass analyzer 204, wherein the beam dump assembly is operable to generally entrain particles 222 or undesirable ions, thus generally preventing contamination of the selected ion beam 212. Accordingly, the beam dump assembly may be located at any location within the ion implantation system 200 where contamination of the selected ion beam 212 is a concern.

Figure 4:
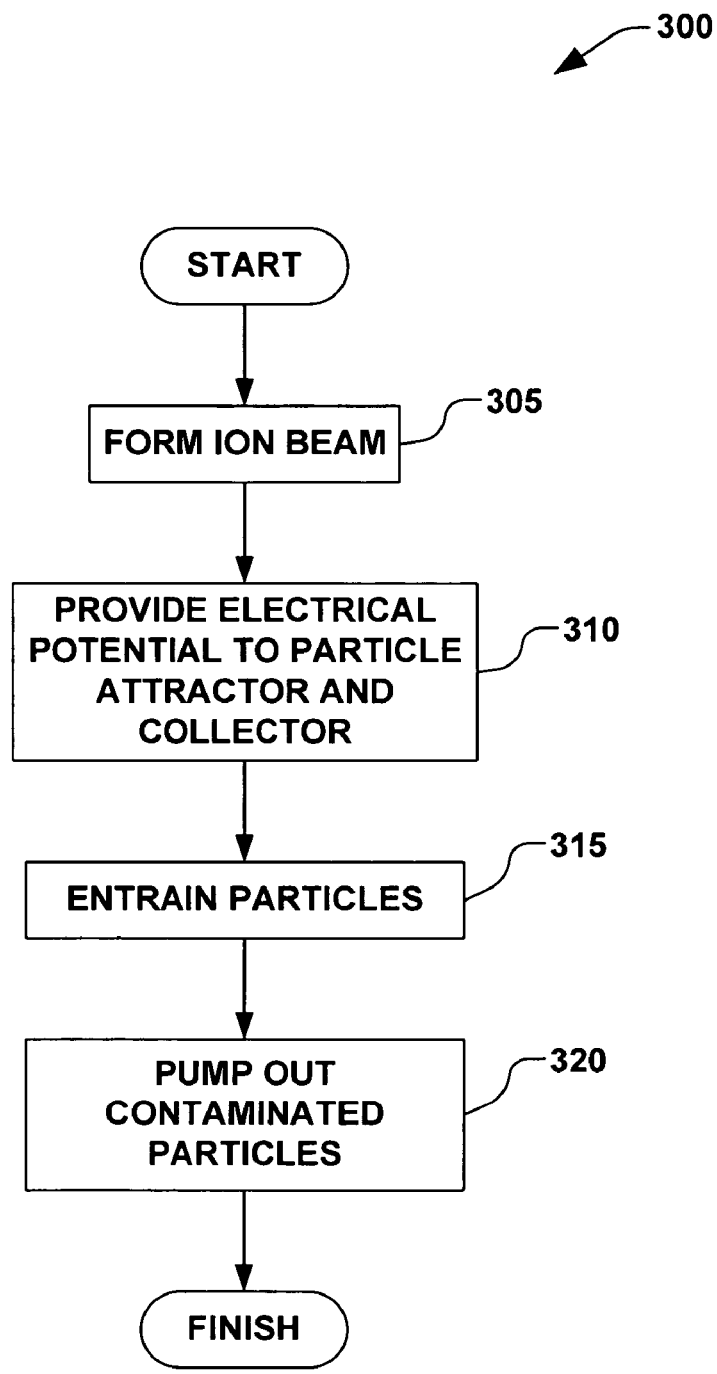
FIG. 4 is a block diagram of a method for controlling contamination in an ion implantation system according to another exemplary aspect of the invention.

According to still another exemplary aspect of the present invention, FIG. 4 is a schematic block diagram of an exemplary method 300 illustrating a method for controlling particulate contamination within an ion implantation system, such as the ion implantation system 200 of FIG. 2. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 4, the method 300 begins with forming an ion beam in an ion implantation system having a beam dump assembly associated therewith in act 305. In act 310, an electrical potential is provided to a particle attractor associated with the beam dump assembly, wherein the electrical potential is generally opposite to an electrical potential of that of the ion beam. Upon application of the electrical potential to the particle attractor, ions or particles entering the beam dump assembly (e.g., waste ion beams 218 of FIG. 2) are generally entrained within the beam dump assembly in act 315. In act 320, ions or particles that are suspended in a gas within the beam dump assembly are further pumped out of the beam dump assembly, therein substantially mitigating contamination within the ion implantation system.

Accordingly, the present invention generally provides a level of particle control that is presently unseen in the ion implantation industry. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A device for reducing contamination in an ion implantation system, comprising:
    a particle collector having a collection region defined therein;
    a particle attractor generally positioned within the collection region of the particle collector; and
    a shield operable to constrain an electrical potential associated with the particle attractor to within the collector region of the particle collector.

2. The device of claim 1, wherein the particle collector comprises a generally concave housing, wherein an interior region of the housing generally defines the collection region.

3. The device of claim 2, wherein the housing is comprised of an electrically conductive material.

4. The device of claim 3, wherein the electrically conductive material comprises a metal.

5. The device of claim 2, wherein the housing comprises a lining generally covering an interior surface of the housing.

6. The device of claim 5, wherein the lining comprises carbon.

7. The device of claim 6, wherein the lining is comprised of one or more of graphite and silicon carbide.

8. The device of claim 1, further comprising an insulator, wherein the insulator generally electrically isolates one or more of particle collector, particle attractor, shield, and a wall of the ion implantation system from one another.

9. The device of claim 1, wherein the particle attractor comprises a suppression electrode.

10. The device of claim 9, wherein the suppression electrode comprises one or more of a grid, mesh, perforated plate, wire fence, and parallel wires.

11. The device of claim 1, wherein the shield comprises an electrically grounded, perforated material.

12. The device of claim 11, wherein the shield comprises one or more of a grid, mesh, perforated plate, wire fence, and parallel wires.

13. An ion implantation system, comprising:
    an ion source;
    an end station; and
    a mass analyzer positioned between the ion source and the end station, wherein the mass analyzer comprises an ion beam dump assembly, wherein the ion beam dump assembly comprises a particle collector, a particle attractor disposed within the particle collector, and a shield operable to constrain an electrical potential of the particle attractor to within the particle collector.

14. The ion implantation system of claim 13, wherein the particle attractor comprises a suppression electrode.

15. The ion implantation system of claim 13, wherein the shield comprises an electrically grounded and perforated material.

16. The ion implantation system of claim 15, wherein the perforated material comprises a ground grid comprising carbon.

17. The ion implantation system of claim 13, wherein the ion beam dump assembly is associated with one or more walls of the mass analyzer.

18. The ion implantation system of claim 13, wherein the particle collector comprises an electrically conductive, generally concave housing having a collection region defined therein.

19. The ion implantation system of claim 18, wherein the housing comprises a carbon lining covering an interior surface of the housing.

20. The ion implantation system of claim 13, further comprising an insulator positioned between the beam dump assembly and a wall of the mass analyzer, therein electrically insulating the beam dump assembly from the mass analyzer.

21. The ion implantation system of claim 13, further comprising a pump fluidly coupled to the beam dump assembly, wherein the pump is operable to substantially evacuate contaminant particles from within the beam dump assembly.

22. A method for controlling contamination in an ion implantation system, the method comprising:
    mass analyzing an ion beam, wherein a desired ion beam and one or more waste ion beams are defined;
    applying an electrical potential within a particle collector positioned along a path of one or more of the waste ion beams;
    electrically shielding the particle collector, wherein the electrical potential within the particle collector does not significantly affect a path of the desired ion beam; and
    entraining contamination particles associated with the one or more waste ion beams via the electrical potential within a particle collector after the one or more waste ion beams enter the particle collector.

23. The method of claim 22, wherein the electrical potential applied within the particle collector is generally opposite to an electrical potential of the ion beam.

24. The method of claim 22, further comprising pumping the contamination particles out of the particle collector.

25. The method of claim 22, wherein electrically shielding the particle collector comprises electrically grounding a shield positioned in front of the particle collector along the path of the one or more waste ion beams.

26. The method of claim 22, further comprising an electrical potential to a particle attractor positioned within the particle collector.

27. The method of claim 26, wherein the electrical potential applied within the particle collector differs from the electrical potential applied to the particle attractor.

28. The method of claim 26, wherein one or more of the electrical potentials applied within the particle collector and to the particle attractor ranges up to an energy of the ion beam.

* * * * *